(12) United States Patent
Hoekstra (10) Patent No.: US 10,623,868 B2
(45) Date of Patent: Apr. 14, 2020

(54) MEMS DEVICES AND PROCESSES

(71) Applicant: Cirrus Logic International Semiconductor Ltd., Edinburgh (GB)

(72) Inventor: Tsjerk Hans Hoekstra, Balerno (GB)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 15/987,397

(22) Filed: May 23, 2018

(65) Prior Publication Data

US 2018/0352340 A1 Dec. 6, 2018

Related U.S. Application Data

(60) Provisional application No. 62/512,894, filed on May 31, 2017.

(30) Foreign Application Priority Data

Jun. 19, 2017 (GB) .................................. 1709741.1

(51) Int. Cl.
*H04R 19/04* (2006.01)
*H04R 1/08* (2006.01)
*H04R 19/00* (2006.01)
*B81B 3/00* (2006.01)

(52) U.S. Cl.
CPC .......... *H04R 19/04* (2013.01); *B81B 3/0072* (2013.01); *B81B 3/0086* (2013.01); *H04R 19/005* (2013.01); *B81B 2201/0257* (2013.01); *B81B 2203/0127* (2013.01); *B81B 2203/04* (2013.01); *B81B 2207/012* (2013.01); *B81B 2207/015* (2013.01); *H04R 2201/003* (2013.01)

(58) Field of Classification Search
CPC ........ H04R 19/04; H04R 19/005; H04R 1/08; H04R 9/08; H04R 11/04; H04R 17/02; H04R 21/02
USPC .................................................. 381/174–176
See application file for complete search history.

(56) References Cited

U.S. PATENT DOCUMENTS

| | | | |
|---|---|---|---|
| 7,146,016 B2 * | 12/2006 | Pedersen | B81B 3/0072 381/175 |
| 8,476,804 B2 * | 7/2013 | Hishinuma | H01G 5/16 310/324 |
| 2007/0001551 A1 | 1/2007 | Izumi et al. | |
| 2010/0020991 A1 | 1/2010 | Chen | |
| 2011/0123053 A1 | 5/2011 | Wang et al. | |

(Continued)

FOREIGN PATENT DOCUMENTS

| | | |
|---|---|---|
| CN | 201657310 U | 11/2010 |
| EP | 2658288 A1 | 10/2013 |

(Continued)

OTHER PUBLICATIONS

Combined Search and Examination Report, UKIPO, Application No. GB1709741.1, dated Oct. 31, 2017.

(Continued)

*Primary Examiner* — Suhan Ni
(74) *Attorney, Agent, or Firm* — Jackson Walker L.L.P.

(57) ABSTRACT

The application describes MEMS transducers having a patterned membrane electrode which incorporates a plurality of openings or voids. At least a portion of the peripheral edge of the opening is provided with a plurality of discontinuities e.g. projections and recesses which extend within the plane of the membrane electrode.

19 Claims, 7 Drawing Sheets

(56) References Cited

U.S. PATENT DOCUMENTS

2016/0088401 A1    5/2016   Yoo et al.
2016/0167946 A1    6/2016   Jenkins et al.

FOREIGN PATENT DOCUMENTS

| GB | 2515836 A | 1/2015 |
|---|---|---|
| KR | 20030075906 A | 9/2003 |
| WO | 2007100068 A1 | 9/2007 |

OTHER PUBLICATIONS

Search and Examination Report, UKIPO, Application No. GB1709741.1, dated Jan. 8, 2018.
International Search Report and Written Opinion of the International Searching Authority, International Application No. PCT/GB2018/051388, dated Jul. 5, 2018.
Examination Report under Section 18(3), UKIPO, Application No. GB1709741.1, dated Nov. 27, 2019.
Examination Opinion, Taiwan Intellectual Property Office, Application No. 107117986, dated Nov. 25, 2019.

* cited by examiner

MEMS DEVICES AND PROCESSES

TECHNICAL FIELD

This application relates to micro-electro-mechanical system (MEMS) devices and processes, and in particular to a MEMS device and process relating to a transducer, for example a capacitive microphone.

BACKGROUND INFORMATION

MEMS devices are becoming increasingly popular. MEMS transducers, and especially MEMS capacitive microphones, are increasingly being used in portable electronic devices such as mobile telephone and portable computing devices.

Microphone devices formed using MEMS fabrication processes typically comprise one or more moveable membranes and a static backplate, with a respective electrode deposited on the membrane(s) and backplate, wherein one electrode is used for read-out/drive and the other is used for biasing. A substrate supports at least the membrane(s) and typically the backplate also. In the case of MEMS pressure sensors and microphones the read out is usually accomplished by measuring the capacitance between the membrane and backplate electrodes. In the case of transducers, the device is driven, i.e. biased, by a potential difference provided across the membrane and backplate electrodes.

Figure 1A:
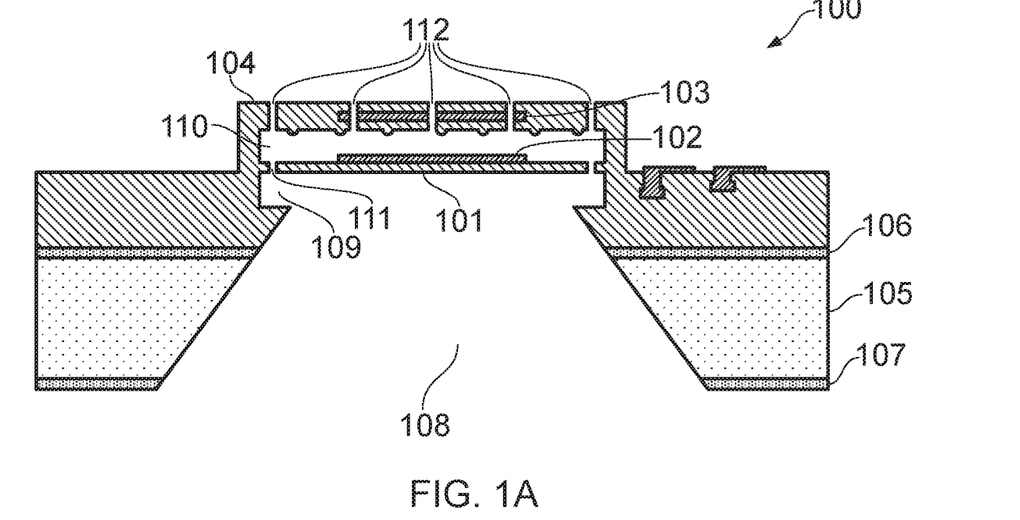
FIGS. 1A and 1B illustrate known capacitive MEMS transducers in section and perspective views.
Figure 1B:
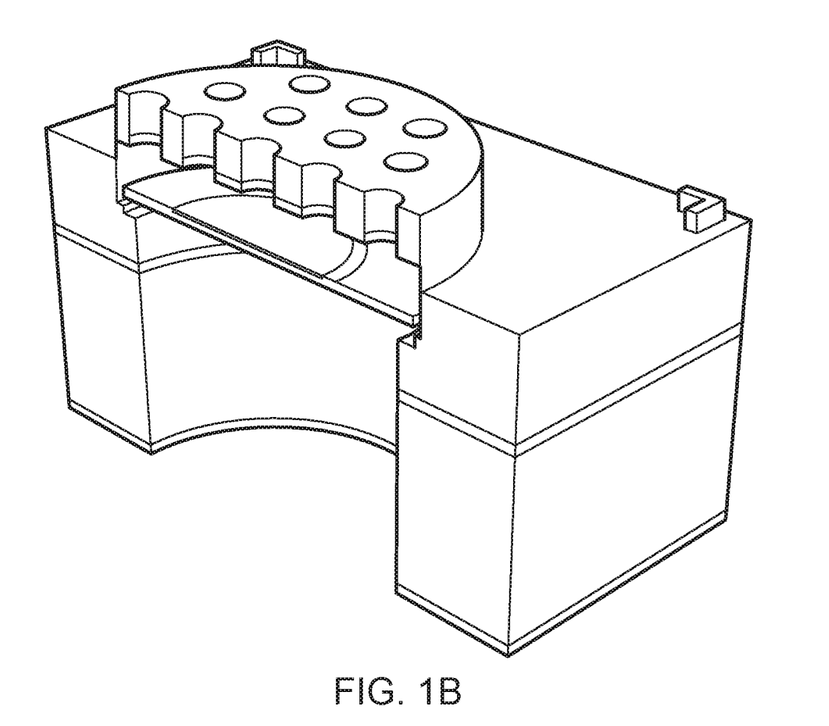

FIGS. 1A and 1B show a schematic diagram and a perspective view, respectively, of a known capacitive MEMS microphone device 100. The capacitive microphone device 100 comprises a membrane layer 101 which forms a flexible membrane which is free to move in response to pressure differences generated by sound waves. A first electrode 102 is mechanically coupled to the flexible membrane, and together they form a first capacitive plate of the capacitive microphone device. A second electrode 103 is mechanically coupled to a generally rigid structural layer or back-plate 104, which together form a second capacitive plate of the capacitive microphone device. In the example shown in FIG. 1A the second electrode 103 is embedded within the back-plate structure 104.

The capacitive microphone is formed on a substrate 105, for example a silicon wafer which may have upper and lower oxide layers 106, 107 formed thereon. A cavity 108 in the substrate and in any overlying layers (hereinafter referred to as a substrate cavity) is provided below the membrane, and may be formed using a "back-etch" through the substrate 105. The substrate cavity 108 connects to a first cavity 109 located directly below the membrane. These cavities 108 and 109 may collectively provide an acoustic volume thus allowing movement of the membrane in response to an acoustic stimulus. Interposed between the first and second electrodes 102 and 103 is a second cavity 110. A plurality of holes, hereinafter referred to as bleed holes 111, connect the first cavity 109 and the second cavity 110.

A plurality of acoustic holes 12 are arranged in the back-plate 4 so as to allow free movement of air molecules through the back plate, such that the second cavity 10 forms part of an acoustic volume with a space on the other side of the back-plate. The membrane 11 is thus supported between two volumes, one volume comprising cavities 9 and substrate cavity 8 and another volume comprising cavity 11 and any space above the back-plate. These volumes are sized such that the membrane can move in response to the sound waves entering via one of these volumes. Typically the volume through which incident sound waves reach the membrane is termed the "front volume" with the other volume, which may be substantially sealed, being referred to as a "back volume".

In some applications the backplate may be arranged in the front volume, so that incident sound reaches the membrane via the acoustic holes 112 in the backplate 104. In such a case the substrate cavity 108 may be sized to provide at least a significant part of a suitable back-volume. In other applications, the microphone may be arranged so that sound may be received via the substrate cavity 108 in use, i.e. the substrate cavity forms part of an acoustic channel to the membrane and part of the front volume. In such applications the backplate 4 forms part of the back-volume which is typically enclosed by some other structure, such as a suitable package.

It should also be noted that whilst FIGS. 1A and 1B show the backplate being supported on the opposite side of the membrane to the substrate, arrangements are known where the backplate is formed closest to the substrate with the membrane layer supported above it.

In use, in response to a sound wave corresponding to a pressure wave incident on the microphone, the membrane is deformed slightly from its equilibrium or quiescent position. The distance between the membrane electrode 102 and the backplate electrode 103 is correspondingly altered, giving rise to a change in capacitance between the two electrodes that is subsequently detected by electronic circuitry (not shown).

The membrane layer and thus the flexible membrane of a MEMS transducer generally comprises a thin layer of a dielectric material—such as a layer of crystalline or polycrystalline material. The membrane layer may, in practice, be formed by several layers of material which are deposited in successive steps. Thus, the flexible membrane 101 may, for example, be formed from silicon nitride $Si_3N_4$ or polysilicon. Crystalline and polycrystalline materials have high strength and low plastic deformation, both of which are highly desirable in the construction of a membrane. The membrane electrode 102 of a MEMS transducer is typically a thin layer of metal, e.g. aluminium, which is typically located in the centre of the flexible membrane 101, i.e. that part of the membrane which displaces the most. It will be appreciated by those skilled in the art that the membrane electrode may be formed by depositing a metal alloy such as aluminium-silicon for example. The membrane electrode may typically cover, for example, around 40% of area of the membrane, usually in the central region of the membrane.

Thus, known transducer membrane structures are composed of two layers of different material—typically a dielectric layer (e.g. SiN) and a conductive layer (e.g. AlSi).

Typically the membrane layer 101 and membrane electrode 102 may be fabricated so as to be substantially planar in the quiescent position, i.e. with no pressure differential across the membrane, as illustrated in FIG. 1A. The membrane layer may be formed so as to be substantially parallel to the back-plate layer in this quiescent position, so that the membrane electrode 102 is parallel to the back-plate electrode 103. However, over time, the membrane structure may become deformed—e.g. as a consequence of relatively high or repeated displacement—so that it will not return to exactly the same starting position.

It will be appreciated that both the membrane and the membrane electrode will suffer intrinsic mechanical stress after manufacture. The composite membrane and membrane electrode structure is typically formed by deposition which takes place at high temperatures of around a few hundred degrees Celsius. On return to room temperature, and as a consequence of the membrane and membrane electrode having greatly different thermal coefficients of expansion, the two layers contract by different amounts. Since the two layers are intimately mechanically coupled together, thus preventing the dissipation of stress by independent mechanical contraction, thermal induced mechanical stress arises within the layers of the membrane and membrane electrode structure. Thus, even at equilibrium (when the pressure differential across the membrane is substantially zero) the composite structure will tend to deform as a result of the thermal induced stress. This is similar to the well-known operation of bi-metallic strip thermostat sensors.

Figure 2A:
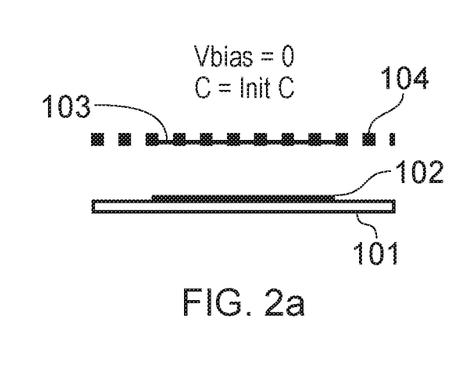
FIGS. 2a-2c illustrate how a membrane may be deformed.
Figure 2B:
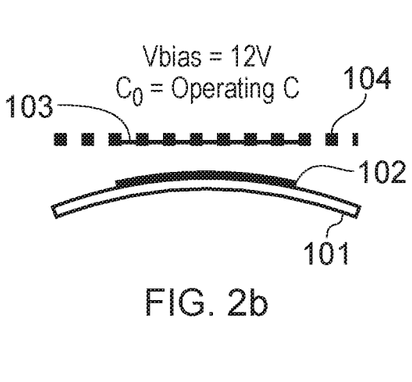
Figure 2C:
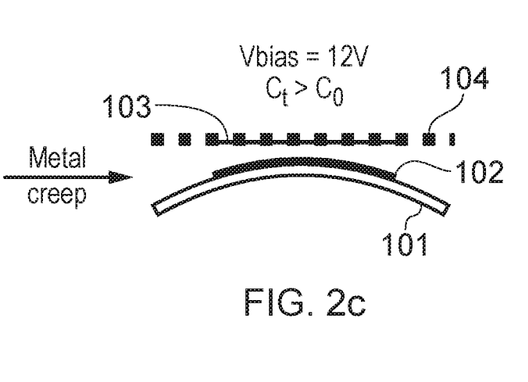

The deformation of the membrane and membrane electrode structure may be further exacerbated as a result of additional stresses that arise when the structure is subject to the application of a voltage bias across the metal electrodes. This is illustrated in FIGS. 2a through 2c which show the equilibrium or quiescent position of a composite membrane structure under different circumstances. Specifically, FIG. 2a illustrates the relative arrangement between a backplate plate electrode 103, which is supported by a backplate structure 104, and a membrane electrode 102, which is deposited on the top surface of a membrane 101, when there is no voltage applied across the pair of electrodes. It will be appreciated that FIG. 2a illustrates the ideal situation in which the membrane electrode structure is substantially planar. However, as discussed above, even when the pressure differential across the membrane is substantially zero and without a bias voltage being applied, the membrane and membrane electrode structure will actually exhibit some deformation due to the thermal stresses induced at manufacture.

FIG. 2b illustrates the membrane and membrane electrodes structure when a voltage bias is applied across the pair of electrodes. Specifically, as illustrated in FIG. 2b, the application of a voltage bias causes the electrostatic deformation of the composite membrane structure. The resultant capacitance is defined as the operating capacitance Co of the transducer.

In FIG. 2c the longer-term effects of the electrostatic deformation are illustrated. Specifically, it will be appreciated that the electrostatic deformation of the membrane structure causes a stretching force to be exerted on the metal electrode layer. Thus, additional tensile stress arises within the metal electrode layer which leads to the lengthening or elongation of the metal. This elongation or additional tensile stress increasing the deformation in the membrane and membrane electrode over time. Thus, as illustrated by FIG. 2c, the distance between the backplate and membrane electrodes slowly decreases over time and, consequently, the capacitance at a time t (Ct) will be greater than the initial operating capacitance Co. This can lead to a DC offset in the measurement signal from such a transducer, as the capacitance at the quiescent position is not the same. Furthermore, for a.c. audio signals, the change in capacitance leads to a variation in the signal charge for a given acoustic stimulus, i.e. the acousto-electrical sensitivity of the microphone.

It will be appreciated that the equilibrium or quiescent position of the membrane structure comprising the membrane and the membrane electrode is affected by the thermal interface stress induced at the time of manufacture, and is further affected by additional tensile stresses arising during the use of the transducer. These tensile stresses may contribute to the occurrence of a drift in sensitivity over time. The level or degree of sensitivity drift is typically very small. However, more recent applications of MEMS microphones (e.g. the use of MEMS microphones within a beamforming array of microphones] may require new levels of performance stability.

The present disclosure invention relates to MEMS transducers and processes which seek to alleviate the occurrence of sensitivity drift, also known as creep, for example by providing a transducer which exhibits a reduced plastic deformation as compared to sheet electrode designs but which also demonstrate a more stable sensitivity or performance. In particular, examples described herein provide membrane electrode designs which seek to achieve a reduction in sensitivity drift over time.

SUMMARY OF EMBODIMENTS

According to an example embodiment of a first aspect there is provided a MEMS transducer comprising:

a flexible membrane;

a membrane electrode formed on a first surface of the flexible membrane, the membrane electrode comprising a layer of conductive material;

at least one opening formed in the membrane electrode, wherein at least a portion of the peripheral edge of the opening is provided with a plurality of discontinuities which extend within the plane of the membrane electrode.

Thus, according to example embodiments, the openings provided in a membrane electrode exhibit a modified peripheral edge. Specifically, the peripheral edge, or at least a part of the peripheral edge is modified to include a plurality of discontinuities. The discontinuities may comprises a plurality of projections and/or recesses which extend in the plane of the membrane electrode. Preferably, the discontinuities comprise a series of alternate projections and recesses. In this case, the series of alternate projections and recesses define a path around the portion of the peripheral edge, wherein the path exhibits a wave-like shape having an amplitude that varies within the plane of the membrane electrode.

The MEMS transducer may further comprise a backplate comprising a back-plate electrode, the backplate electrode having a plurality of holes corresponding to a plurality of back-plate holes through the back-plate; wherein at least part of the area of said opening formed in the membrane electrode corresponds to the area of at least one back-plate hole, in a direction normal to the membrane. Preferable the perimeter of the at least one backplate hole substantially maps onto the notional perimeter of the opening in the membrane electrode when projected onto the plane of the membrane electrode in a direction normal to the membrane.

Thus, at a plurality of different points along the portion of the peripheral edge of the opening, there is a variation (e.g. a periodic variation) in a distance between the peripheral edge of the opening and a peripheral edge of a corresponding backplate hole when projected onto the plane of the membrane electrode.

According to an example embodiment of second aspect there is provided a MEMS transducer comprising:

a flexible membrane;

a membrane electrode formed on a first surface of the flexible membrane, the membrane electrode comprising a layer of conductive material, at least one opening formed in the membrane electrode, the opening having a general shape which is defined by a notional perimeter, wherein at least a portion of the peripheral edge of the opening is provided with one or more deviations which extend in a direction normal to the notional perimeter of the opening within the plane of the membrane electrode.

According to an example embodiment of a third aspect there is provided a MEMS transducer comprising:

a flexible membrane;

a membrane electrode coupled to a first surface of the flexible membrane, the membrane electrode comprising a layer of conductive material and having at least one opening, the opening being defined by a peripheral edge;

a backplate comprising a back-plate electrode, the back-plate electrode having at least one hole which corresponds to the at least one opening of the membrane electrode;

wherein there is a variation in a distance between the peripheral edge of the opening in the membrane electrode and a point where a line drawn normal to the centre of the corresponding backplate hole intersects the opening.

According to an example embodiment of a fourth aspect there is provided a MEMS transducer comprising:

a flexible membrane that comprises a conductive electrode;

wherein the conductive electrode comprises at least one opening, wherein at least a portion of the peripheral edge of the at least one opening is provided with a plurality of discontinuities which extend within the plane of the conductive electrode.

The flexible membrane may comprise a crystalline or polycrystalline material. The flexible membrane may comprise silicon nitride. The membrane electrode may comprise metal or a metal alloy. The membrane electrode may comprise aluminium. The transducer may comprise a capacitive sensor. The transducer may comprise a microphone. The MEMS transducer may further comprise readout circuitry. The readout circuitry may comprise analogue and/or digital circuitry. The transducer may be located within a package having a sound port. The transducer may be arranged within the package such that the membrane layer directly faces the acoustic port.

BRIEF DESCRIPTION OF THE DRAWINGS

For a better understanding of the present invention, and to show how the same may be carried into effect, reference will now be made, by way of example, to the accompanying drawings in which.

DETAILED DESCRIPTION

In an earlier application filed by the present Applicant a MEMS transducer was disclosed in which the membrane electrode comprises at least one opening, wherein at least part of the area of the opening corresponds to the area of a back-plate hole in a direction normal to the membrane. In other words the area of at least part of the opening in the membrane electrode aligns (in a direction normal to the membrane) with at least part of the area of a back-plate hole. By providing such openings in the membrane electrode, the total amount of metal forming the membrane electrode can be reduced compared to a membrane electrode having a similar diameter but without any such openings, i.e. the membrane electrode having the openings provides less coverage of the flexible membrane.

Figure 3A:
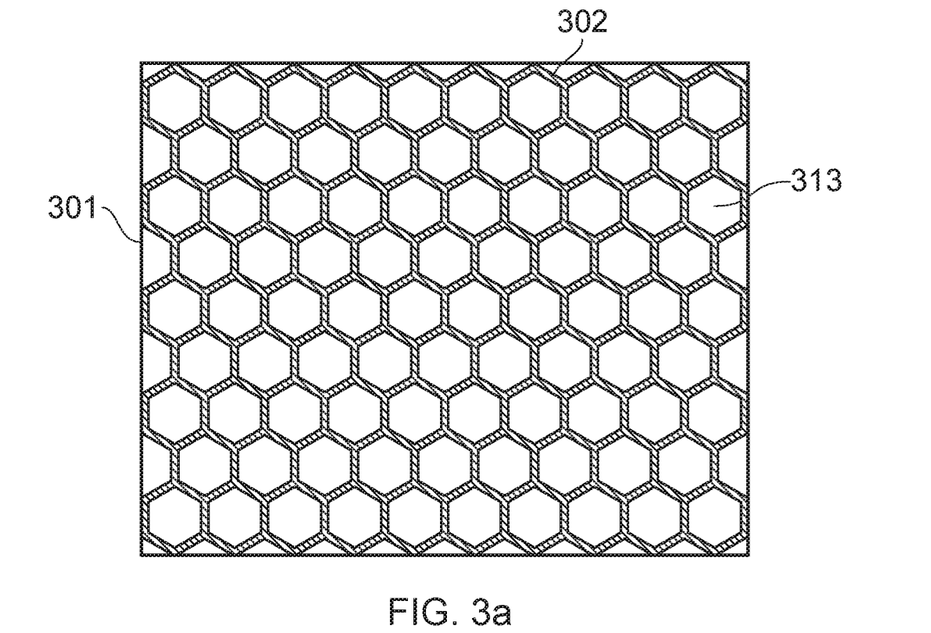
FIG. 3a illustrates a plan view of a previously considered membrane electrode structure that is patterned to incorporate openings.
Figure 3B:
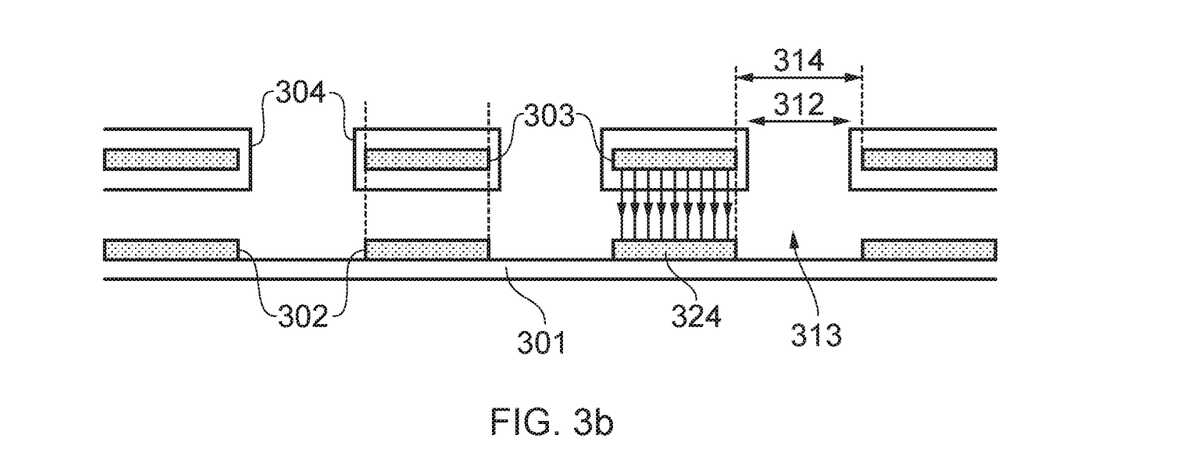
FIG. 3b illustrates a cross section through a membrane electrode structure that is patterned to incorporate openings.

FIGS. 3a and 3b illustrate plan and cross-sectional view respectively of such a previously proposed MEMS transducer comprising a membrane electrode 302 formed on a flexible membrane 301. The membrane electrode 302 has a plurality of openings, i.e. material voids, 313 in the electrode material 302 where there is no coverage of the membrane 301. These openings (or areas of absence) 313 reduce the amount of electrode material 302 which is deposited on the membrane 301 (for a given diameter of electrode) and therefore increase the proportion of membrane material to electrode material compared to the electrode without such openings or voids. This in turn will lead to a membrane structure 301/302 which has reduced plastic deformation. In use this structure will 301/302 is expected to deform less and this improves the operation of the MEMS transducer 100 compared to a membrane electrode without such voids or openings.

FIG. 3b illustrates a part of a cross-section of the previously proposed transducer and additionally illustrates the backplate structure 304 in a plane above the membrane and membrane electrode structure. The backplate structure comprises a back-plate electrode 303. Acoustic holes 312 are provided through the backplate structure. These acoustic holes 312 allow acoustic communication between the cavity between the membrane and back-plate and a volume on the other side of the membrane (which could be a sound port or a back-volume). As one skilled in the art will appreciate, and as illustrated in FIG. 3b, in a parallel plate capacitor which is charged/biased there will be an electrostatic field component running from one plate to the other in a direction perpendicular to the plates.

However, although transducers comprising a patterned electrode are less susceptible to plastic deformation, they have still been shown to demonstrate a degree of change—or drift—in sensitivity over time. This may be at least in part due to the additional tensile strain that arises as a consequence of the elongation of the metal layer which occurs when a voltage bias is applied to the electrodes of the transducer.

Figure 4:
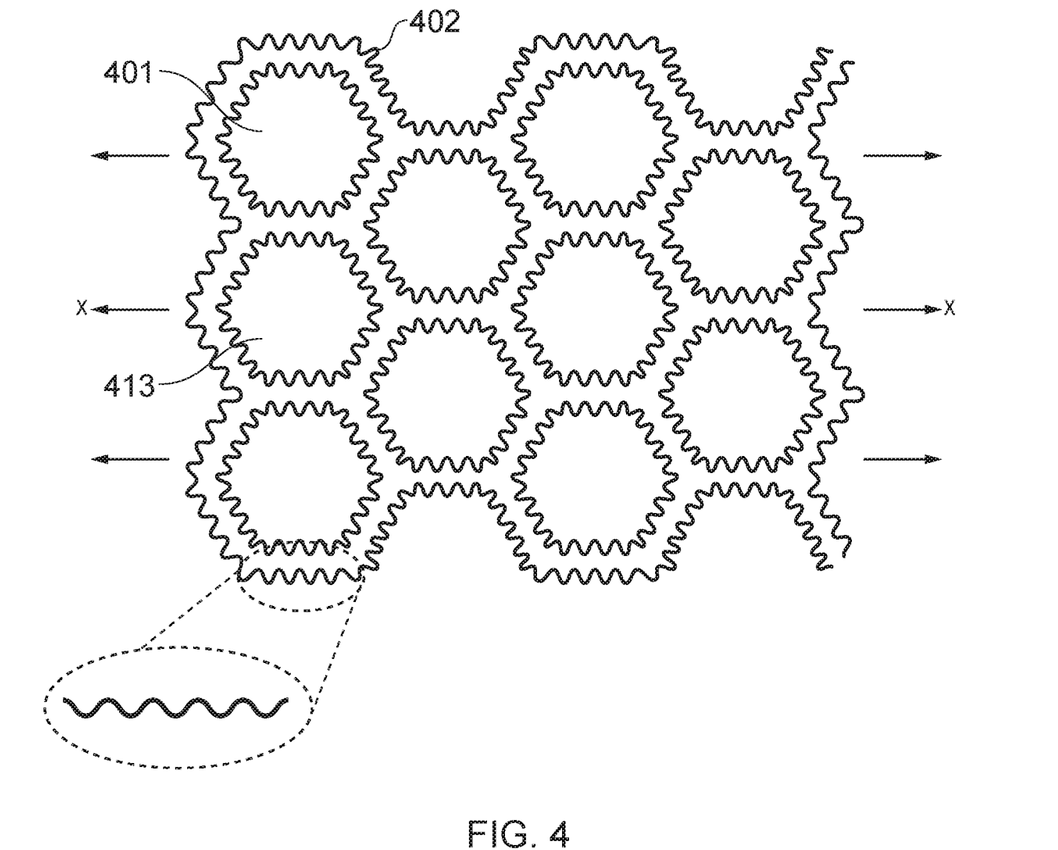
FIG. 4 illustrates a part of a membrane electrode formed on a flexible membrane according to first example embodiment.

FIG. 4 illustrates a part of a membrane electrode 402 formed on a flexible membrane 401 of a MEMS transducer according to first example embodiment. The membrane 401 and membrane electrode 402 together form a membrane structure. The membrane electrode 402 is formed of a conductive material and is provided with a plurality of openings 413 in the electrode material 342 where there is no coverage of the membrane 401. The openings, i.e. voids, are generally hexagonal in shape. These openings (or areas of absence) 413 reduce the amount of electrode material which is deposited on the membrane 401 resulting in a membrane structure 401/402 which has reduced plastic deformation. The membrane electrode can be considered to exhibit a grid or lattice-like structure in which strips of electrode material form a pattern of open spaces between the strips. Thus, the membrane electrode can be considered to be an electrically continuous conductive layer having one or more perforations or apertures, i.e. openings, within the conductive layer.

The border or peripheral edge of each opening, which is formed by one or more strips of electrode material, exhibits a plurality of discontinuities. In the context of the present invention the term "discontinuity" should be understood to mean an interruption or deviation in the edge surface which extends in a direction normal to the notional perimeter of the opening and within the plane of the membrane electrode (or opening).

It is helpful to consider the discontinuities formed in a peripheral edge of an opening in relation to a "notional perimeter" which defines the overall/general shape of the opening. Thus, in the case of a hexagonal opening as illustrated in FIG. 4, a number of straight line, i.e. linear sections may be drawn between the vertices of the hexagon, and these linear, i.e. straight, line sections can be considered to form the notional perimeter of the opening. The notional perimeter can be considered to define a notional path axis (x). As a consequence of the discontinuities in the peripheral edge of the opening, the path that is traced by the peripheral edge of an opening can be considered to vary in a direction orthogonal to the notional path axis. According to at least one example, the path traced can be considered to exhibit a non-linear or periodic function.

It will be appreciated that the perimeter of the peripheral edge of the opening is longer than the notional perimeter. The increased length of the perimeter of the peripheral edge of the opening will depend on a number of factors such as, for example, the frequency and amplitude of the discontinuities. Thus, the opening exhibits a modified perimeter having a length that is 2 to 30 times longer than the notional perimeter.

It will be appreciated that whilst the general/overall shape of each of the openings illustrated in FIG. 4 is hexagonal, numerous other opening shapes are envisaged including square, rectangular, circular or polygonal.

A projection can be considered to be a region where the membrane electrode material projects or extends in a first direction orthogonal to the notional perimeter in the plane of the membrane electrode. A recess can be considered to be a region where the opening extends beyond in a direction opposite to the first direction in the plane of the membrane. Thus, the discontinuities can comprise a series of alternate projections and recesses which extend within the plane of the layer of membrane electrode material (at equilibrium).

According to example embodiments described herein the discontinuities provided in a peripheral edge of an opening formed in the layer of membrane electrode material may be considered to trace a path around the perimeter of the opening which exhibits a periodic or wave-like shape. Thus, the wave-like shape will have an amplitude that varies within the plane of the electrode layer. In the example embodiment illustrated in FIG. 4, the peripheral edge can be considered to trace a path which follows a generally sinuous-shape of frequency f. It is possible that the wave-like shape will have a frequency f that varies along a peripheral edges which may be instead of, or in addition to, a wave-like shape having an amplitude that varies.

Figure 5A:
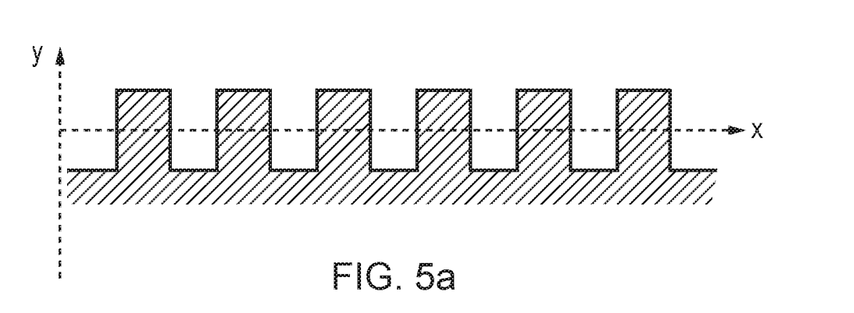
FIGS. 5a to 5d illustrate a number of peripheral edge portions.
Figure 5B:
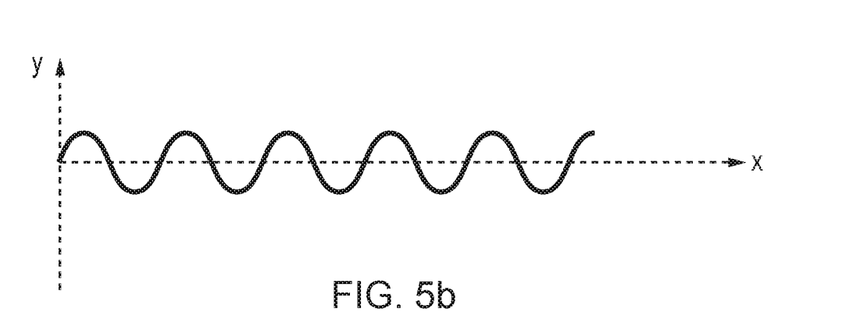
Figure 5C:
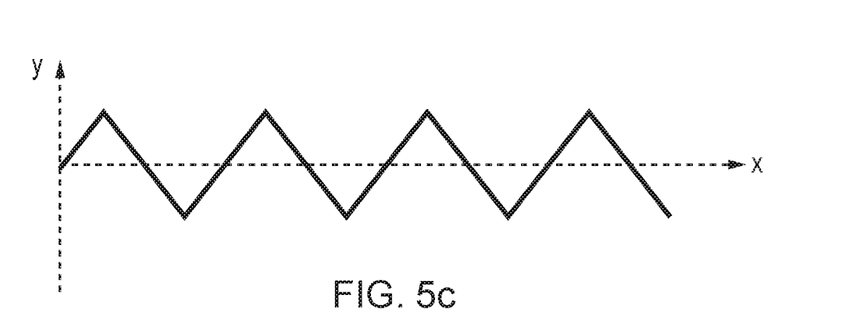
Figure 5D:
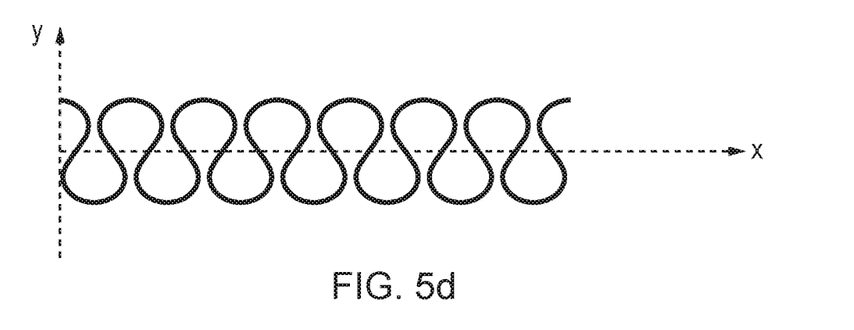

A number of portions of peripheral edges having wave-like shapes are illustrated in FIGS. 5a to 5d wherein the notional perimeter of the opening can be considered to be substantially aligned with an x-axis and the projections and recesses exhibit a variance in the y direction (i.e. orthogonal to the notional perimeter of the opening and in-plane with the membrane electrode at equilibrium). Specifically, as illustrated in FIG. 5a the discontinuities may be generally square/rectangular in shape, such that the peripheral edge will trace a path that exhibits a square-wave form. Alternatively, as illustrated in FIG. 5b, the discontinuities may exhibit a curved or arcuate form such that the peripheral edge will trace a path that forms a sinusoidal waveform. As shown in FIG. 5c, the discontinuities may be generally triangular in shape, such that the peripheral edge will trace a path that exhibits a triangular-wave form. FIG. 5d shows a further alternative design in which the discontinuities comprise a plurality of arcuate portions having a relatively large radius. This example can be described as having a serpentine or folded form.

The diameter of an opening may have a diameter in the range of 10 μm to 100 μm. The amplitude of the wave-like shapes formed at a peripheral edge of one or more openings in a membrane electrode layer may be between 5 μm and 50 μm, may exhibit a wavelength of between 5 μm and 50 μm and a line width of between 0.1 μm and 10 μm.

It will be appreciated that the frequency and/or amplitude of the wave-like shape may be varied such that the number of wavelengths that is traced around the entire perimeter of the opening varies e.g. between 8 wavelengths and 60 wavelengths.

The potential benefits of the present examples may be appreciated by considering the elongation of the metal electrode that occurs, as illustrated in FIGS. 2a-2c, when a voltage bias is applied between the membrane electrode and a fixed, backplate, electrode. In particular, the discontinuities formed within the peripheral edges of the openings allow the metal electrode to more readily stretch, or elongate, when the membrane structure undergoes an electrostatic deformation in response to the application of a voltage bias. In other words, the stress-strain curve of the metal electrode is altered. Consequently, the tensile stresses arising within the electrode material at Vbias is reduced, with the associated benefit that the degree of deformation of the dual-layer membrane structure will be less changeable over time. Thus, advantageously, the sensitivity of the transducer will be less prone to drift and the performance of the transducer will be more stable. The examples described herein can be considered to demonstrate a reduction in the rigidity of the lattice-like structure of the membrane electrode.

The relaxing effect of the discontinuities is particularly apparent according to examples wherein the discontinuities provided in a peripheral edge of an opening formed in the layer of membrane electrode material trace a path which exhibits a wave-like shape. Referring to FIG. 4, and considering the effect of a lengthwise elongation of the metal electrode during Vbias, as indicated by the arrows, it can be appreciated that at least some edges of the metal electrode—in particular those generally aligned with the X direction—will be able to accommodate the elongation as the adjacent peaks/troughs of the waveform will be able to separate. Thus, the resultant tensile or elongation stresses arising within the metal electrode will be significantly reduced compared to prior examples where the lattice-like structure of the membrane electrode exhibits a higher rigidity. In order to help visualise the effect of the present examples, the separation and subsequent retraction of the peaks/troughs provided on the peripheral edge can be considered to be akin to the stretching and compression of adjacent folds of a concertina or accordion.

Figure 6A:
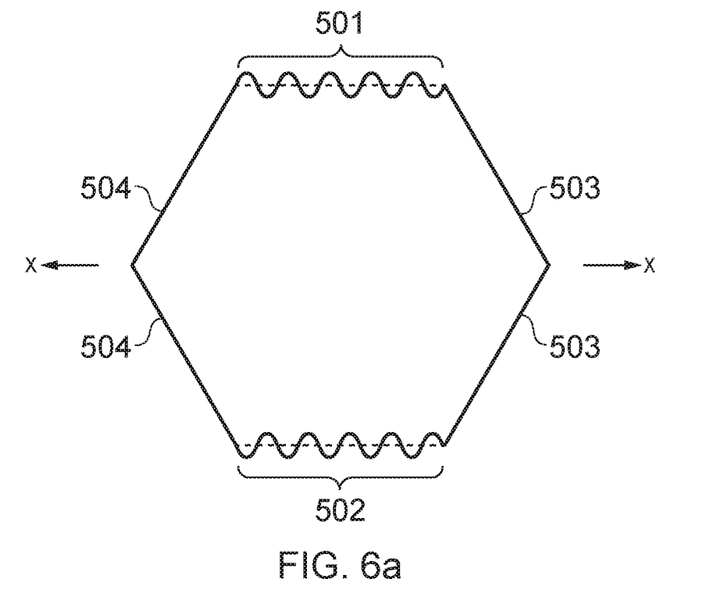
FIGS. 6a and 6b each illustrate a membrane electrode opening according to further example embodiments.
Figure 6B:
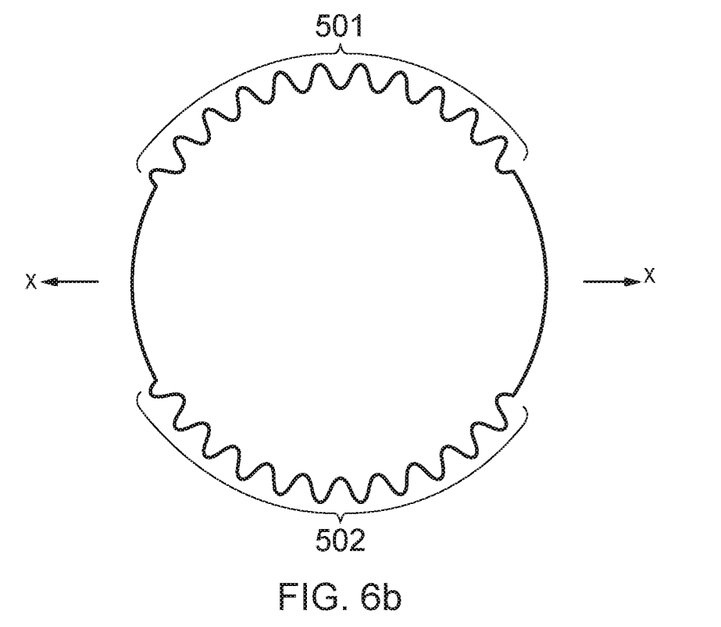

It will be appreciated that, according to examples of a further embodiment, only a part of the perimeter of an opening in a membrane electrode layer need to be provided with discontinuities. Thus, according to one such example in which an opening provided within a membrane electrode layer is a polygon defined by a plurality of peripheral or perimeter edges, one or more of those edges may be provided with discontinuities whilst one or more of the edges traces a straight line path between adjacent vertices of the opening. According to another example in which an opening provided within a membrane electrode layer is substantially circular in shape, only a part of the perimeter of the opening may be provided with discontinuities. The location of the or each peripheral edge, or each section of the peripheral edge, that is provided with discontinuities may be selected having regard for the expected axis of elongation i.e. the likely direction of elongation forces that will arise during Vbias. Having regard for FIG. 4, an alternative example is envisaged in which only those edges of the opening that are generally parallel to the elongation direction of the membrane electrode are provided with discontinuities. A single opening, according to this example, is illustrated in FIG. 6*a*. A single opening according to an alternative example in which the opening is substantially circular in shape is illustrated in FIG. 6*b*. Thus, the perimeter of the generally circular opening is provided with: first and second sections 501 and 502 respectively that are provided with a plurality of discontinuities in the form of alternate projections and recesses which extend within the plane of the opening; and third and fourth sections 503 and 504 respectively that are continuous, i.e. that do not have any discontinuities in the form of alternate projections and recesses which extend within the plane of the opening. It will be appreciated that the first and second sections need not correspond precisely to the length of one perimeter edge of the opening, as shown in FIG. 6*a*, but may be shorter or slightly longer than the length of one perimeter edge.

A transducer comprising a membrane structure according to examples of the present embodiments will preferably be provided with a backplate structure which supports a backplate electrode. As previously discussed, the backplate and backplate electrode are provided with acoustic holes to allow free movement of air molecules through the back plate. According to preferred examples of the present embodiments, the location of the acoustic holes in the back-plate and the back-plate electrode correspond to the location of the openings in the membrane electrode (or vice versa). By correspond it is meant that the position of the openings in the membrane will be substantially the same as the position of the holes in the back-plate electrode as viewed from a direction normal to the membrane (or back-plate electrode). Therefore were the acoustic holes of the backplate electrode to be projected onto the membrane electrode in such a direction, then the areas of the projected holes would substantially map on to the notional area (i.e. the area defined by the notional perimeter) of the openings in the membrane electrode.

Since the openings provided in the membrane electrode will be provided with at least one edge or edge section which is provided with a plurality of discontinuities, it will be appreciated that the sizes and/or shape of the membrane electrode openings and the acoustic holes in the back-plate electrode will not be precisely the same. However according to one preferred example, the perimeter of one or more of the holes in the backplate electrode correspond in size and projected planar location to the notional perimeter of the one or more of the openings in the membrane electrode.

Figure 7A:
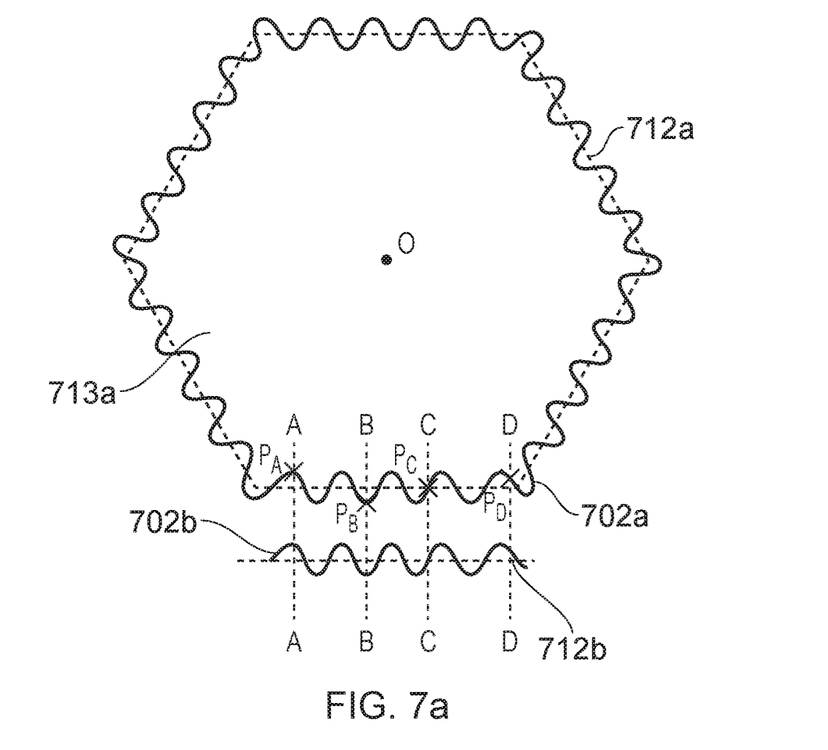
FIGS. 7a and 7b illustrate the relative lateral position of an opening in a membrane electrode relative to the lateral position of a corresponding hole in the backplate electrode.

FIGS. 7*a* and 7*b* illustrate the relative lateral position (x/y coordinates) of an opening 713*a* in a membrane electrode— the perimeter or peripheral edge of which is illustrated in FIG. 7*a* by a solid line 702*a*—relative to the lateral position (x/y coordinates) of a corresponding hole in the backplate electrode—the perimeter of which is illustrated in FIG. 7*a* by a broken line 712*a*. The broken line 712*a* also represents the notional perimeter of the membrane electrode opening. In order to consider the relative lateral positions it is useful to consider the position of the backplate electrode—in particular an acoustic hole provided in the backplate electrode—when projected onto the same x/y plane of the upper surface of the membrane electrode, as shown in FIG. 7*a*. FIG. 7*a* also illustrates a part of the peripheral edge 702*b* of an adjacent opening in the membrane electrode and a part of the projected peripheral edge 712*b* of the corresponding adjacent backplate electrode hole, i.e. void, 713*b*. As illustrated, the backplate electrode is provided with a hexagonal shaped hole which is defined by 6 straight edges. The membrane electrode is provide with an opening which is also generally hexagonal in shape, as defined by a notional perimeter of the opening, and has a location which substantially corresponds to the backplate electrode hole (albeit in a different plane). The peripheral edges of the membrane electrode opening exhibits a series of alternate projections and recesses which, in this particular embodiment, define a wave-like, or sinuous, shape having an amplitude that varies in the plane of the opening 713*a*.

Figure 7B:
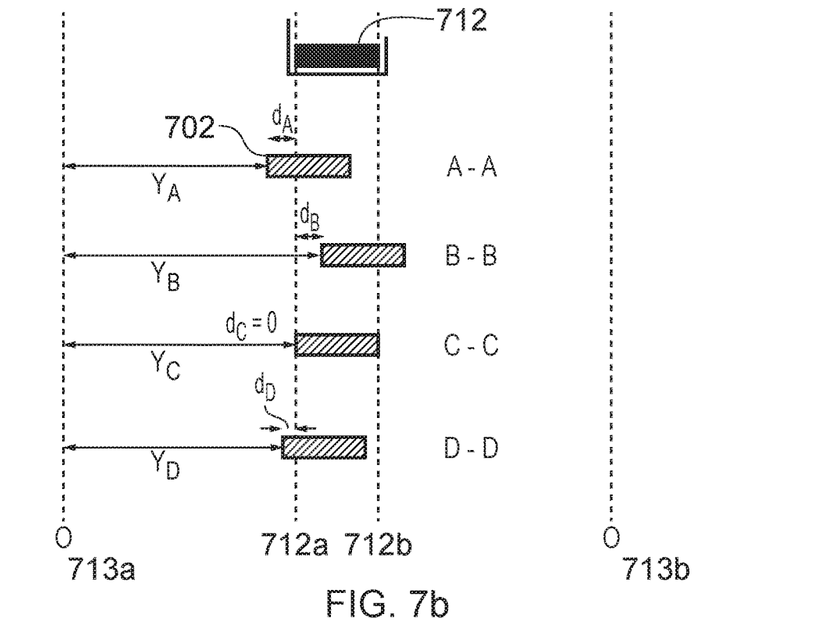

In FIG. 7*b*, a series of cross-sectional views taken through the lines A, B, C and D indicated in FIG. 7*a* are illustrated schematically in order to demonstrate the varying position of a section of membrane electrode material that is dissected by each of the cross-sections, relative to the overlying backplate electrode. The projected (x/y) position of the elongate section of the backplate electrode material that is dissected by each the cross sections A to D will not change and is therefore conveniently indicated by the dotted lines 712*a* and 712*b*. The projected positions of the centres $O_{713a}$ and $O_{713}b$ of the adjacent openings in the membrane electrode are also indicated.

From FIG. 7*b* it can be appreciated that as a consequence of the discontinuities in the peripheral edge of the membrane electrode opening 713*a*, the distance ($d_A$, $d_B$, $d_C$, and $d_D$) between each of points $P_A$ to $P_D$ on the peripheral edge 702 of the opening 713 relative to the projected position of a corresponding point on the corresponding edge of the overlying backplate opening, which will always coincide with the 712*a*, varies. A variation can also be measured in the distance Y between each of the points and the centre $O_{713a}$ of the opening.

Thus, according to at least one example of a MEMS transducer according to the present embodiments, at a plurality of different points along the portion of the peripheral edge of the opening, a distance between the peripheral edge of the opening and a peripheral edge of a corresponding backplate hole when projected onto the plane of the membrane electrode, varies.

Patterning the membrane electrode of a MEMS transducer with one or more openings can be advantageous in reducing the overall amount of membrane electrode which alleviates the interface stresses arising due to the mechanical coupling of the membrane and membrane electrode—which are formed of materials having different thermal expansion coefficients. Furthermore, by designing and/or modifying the peripheral edge shape of at least a part of the opening, further benefits can be achieved in terms of reducing the likelihood of a deformation or creep in the dual layer structure over time.

The flexible membrane may comprise a crystalline or polycrystalline material, such as one or more layers of silicon-nitride $Si_3N_4$ and the membrane electrode may comprise a metal, such as aluminium, titanium, gold or copper, or alloys thereof.

The MEMS transducer will typically be associated with circuitry for processing an electrical signal generated by a variation in the capacitance measured between the two electrodes. Thus, in order to process an electrical output signal from the microphone, the transducer die/device may have circuit regions that are integrally fabricated using standard CMOS processes on the transducer substrate.

The circuit regions may be fabricated in the CMOS silicon substrate using standard processing techniques such as ion implantation, photomasking, metal deposition and etching. The circuit regions may comprise any circuit operable to interface with a MEMS microphone and process associated signals. For example, one circuit region may be a pre-amplifier connected so as to amplify an output signal from the microphone. In addition another circuit region may be a charge-pump that is used to generate a bias, for example 12 volts, across the two electrodes. This has the effect that changes in the electrode separation (i.e. the capacitive plates of the microphone) change the MEMS microphone capacitance; assuming constant charge, the voltage across the electrodes is correspondingly changed. A pre-amplifier, preferably having high impedance, is used to detect such a change in voltage.

The circuit regions may optionally comprise an analogue-to-digital converter (ADC) to convert the output signal of the microphone or an output signal of the pre-amplifier into a corresponding digital signal, and optionally a digital signal processor to process or part-process such a digital signal. Furthermore, the circuit regions may also comprise a digital-to-analogue converter (DAC) and/or a transmitter/receiver suitable for wireless communication. However, it will be appreciated by one skilled in the art that many other circuit arrangements operable to interface with a MEMS transducer signal and/or associated signals, may be envisaged.

It will also be appreciated that, alternatively, the microphone device may be a hybrid device (for example whereby the electronic circuitry is totally located on a separate integrated circuit, or whereby the electronic circuitry is partly located on the same device as the microphone and partly located on a separate integrated circuit) or a monolithic device (for example whereby the electronic circuitry is fully integrated within the same integrated circuit as the microphone).

Examples described herein may be usefully implemented in a range of different material systems, however the examples described herein are particularly advantageous for MEMS transducers having membrane layers comprising silicon nitride.

It is noted that the example embodiments described above may be used in a range of devices, including, but not limited to: analogue microphones, digital microphones, pressure sensor or ultrasonic transducers. The example embodiments may also be used in a number of applications, including, but not limited to, consumer applications, medical applications, industrial applications and automotive applications. For example, typical consumer applications include portable audio players, laptops, mobile phones, PDAs and personal computers. Example embodiments may also be used in voice activated or voice controlled devices. Typical medical applications include hearing aids. Typical industrial applications include active noise cancellation. Typical automotive applications include hands-free sets, acoustic crash sensors and active noise cancellation.

Features of any given aspect or example embodiment may be combined with the features of any other aspect or example embodiment and the various features described herein may be implemented in any combination in a given embodiment.

Associated methods of fabricating a MEMS transducer are provided for each of the example embodiments.

It should be understood that the various relative terms above, below, upper, lower, top, bottom, underside, overlying, underlying, beneath, etc. that are used in the present description should not be in any way construed as limiting to any particular orientation of the transducer during any fabrication step and/or it orientation in any package, or indeed the orientation of the package in any apparatus. Thus the relative terms shall be construed accordingly.

In the examples described above it is noted that references to a transducer may comprise various forms of transducer element. For example, a transducer may be typically mounted on a die and may comprise a single membrane and back-plate combination. In another example a transducer die comprises a plurality of individual transducers, for example multiple membrane/back-plate combinations. The individual transducers of a transducer element may be similar, or configured differently such that they respond to acoustic signals differently, e.g. the elements may have different sensitivities. A transducer element may also comprise different individual transducers positioned to receive acoustic signals from different acoustic channels.

It is noted that in the examples described herein a transducer element may comprise, for example, a microphone device comprising one or more membranes with electrodes for read-out/drive deposited on the membranes and/or a substrate or back-plate. In the case of MEMS pressure sensors and microphones, the electrical output signal may be obtained by measuring a signal related to the capacitance between the electrodes. The examples are also intended to embrace a transducer element being a capacitive output transducer, wherein a membrane is moved by electrostatic forces generated by varying a potential difference applied across the electrodes, including examples of output transducers where piezo-electric elements are manufactured using MEMS techniques and stimulated to cause motion in flexible members.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in a claim, "a" or "an" does not exclude a plurality, and a single feature or other unit may fulfil the functions of several units recited in the claims. Any reference signs in the claims shall not be construed so as to limit their scope.

The invention claimed is:
1. A MEMS transducer comprising:
a back-plate comprising a back-plate electrode;
a flexible membrane;
a membrane electrode formed on a first surface of the flexible membrane, the membrane electrode comprising a layer of conductive material;
at least one opening formed in the membrane electrode, wherein at least a portion of the peripheral edge of the opening is provided with a plurality of discontinuities which extend within the plane of the membrane electrode, and wherein the membrane electrode comprises a lattice-like structure comprising a plurality of strips of electrode material, wherein the openings form a pattern of spaces between the strips of electrode material.

2. A MEMS transducer as claimed in claim 1, wherein the discontinuities comprises a plurality of projections and/or recesses which extend in the plane of the membrane electrode.

3. A MEMS transducer as claimed in claim 2, wherein the discontinuities comprise a series of alternate projections and recesses.

4. A MEMS transducer as claimed in claim 3, wherein the series of alternate projections and recesses define a path around the portion of the peripheral edge, wherein the path exhibits a wave-like shape having an amplitude and/or frequency that varies within the plane of the membrane electrode.

5. A MEMS transducer as claimed in claim 4, wherein the wave-like shape comprises one or more of a sinuous wave, a square wave, a triangular wave.

6. A MEMS transducer as claimed in claim 1, wherein the discontinuities extend in a direction substantially normal to a notional perimeter which defines an overall shape of the opening in the membrane electrode.

7. A MEMS transducer as claimed in claim 6, wherein perimeter of the opening is between 1.5% and 15% longer than the notional perimeter.

8. A MEMS transducer as claimed in claim 1, wherein the at least one opening exhibits a shape that is generally hexagonal, circular, square, rectangular or a polygon.

9. A MEMS transducer as claimed in claim 1, wherein an opening is a region of absence of membrane electrode material that is provided within the plane of the membrane electrode.

10. A MEMS transducer as claimed in claim 1, further comprising:
a backplate comprising a back-plate electrode, the back-plate electrode having a plurality of holes corresponding to a plurality of back-plate holes through the back-plate;
wherein at least part of the area of said opening formed in the membrane electrode corresponds to the area of at least one back-plate hole, in a direction normal to the membrane.

11. A MEMS transducer as claimed in claim 10, wherein the discontinuities extend in a direction substantially normal to a notional perimeter which defines an overall shape of the opening in the membrane electrode, wherein the perimeter of the at least one backplate hole substantially maps onto the notional perimeter of the opening in the membrane electrode when projected onto the plane of the membrane electrode in a direction normal to the membrane.

12. A MEMS transducer as claimed in claim 10 wherein, at a plurality of different points along the portion of the peripheral edge of the opening, there is a variation in a distance between the peripheral edge of the opening and a peripheral edge of a corresponding backplate hole when projected onto the plane of the membrane electrode.

13. A MEMS transducer as claimed in claim 12, wherein the variation in the distance between the peripheral edge of the opening and the peripheral edge of the corresponding backplate hole when projected onto the plane of the membrane electrode, is periodic.

14. A MEMS transducer as claimed in claim 1, wherein the membrane electrode exhibits an axis of elongation along which the membrane electrode experiences elongation forces when a voltage bias is applied between the membrane electrode and the backplate electrode in use, and wherein the portion of the peripheral edge is located so as to be substantially aligned with the axis of elongation.

15. An electronic device comprising a MEMS transducer as claimed in claim 1, wherein said device is at least one of: a portable device; a battery powered device; an audio device; a computing device; a communications device; a personal media player; a mobile telephone; a games device; and a voice controlled device.

16. An integrated circuit comprising a MEMS transducer as claimed in claim 1 and readout circuitry.

17. A MEMS transducer comprising:
a flexible membrane;
a membrane electrode formed on a first surface of the flexible membrane, the membrane electrode comprising a layer of conductive material,
at least one opening formed in the membrane electrode, the opening having a general shape which is defined by a notional perimeter, wherein at least a portion of the peripheral edge of the opening is provided with a series of alternate projections and recesses which extend in a direction normal to the notional perimeter of the opening within the plane of the membrane electrode, wherein the series of alternate projections and recesses define a path around the portion of the peripheral edge, wherein the path exhibits a wave-like shape having an amplitude and/or frequency that varies within the plane of the membrane electrode.

18. A MEMS transducer comprising:
a flexible membrane;
a membrane electrode coupled to a first surface of the flexible membrane, the membrane electrode comprising a layer of conductive material and having at least one opening, the opening being defined by a peripheral edge;
a backplate comprising a back-plate electrode, the back-plate electrode having at least one hole which corresponds to the at least one opening of the membrane electrode;
wherein there is a variation in a distance between the peripheral edge of the opening in the membrane electrode and a point where a line drawn normal to the centre of the corresponding backplate hole intersects the opening.

19. A MEMS transducer as claimed in claim 18, wherein the variation in the distance between the peripheral edge of the opening in the membrane electrode and a point where a line drawn normal to the centre of the corresponding backplate hole intersects the opening, is periodic.

* * * * *